United States Patent
Bovington

(10) Patent No.: US 11,705,692 B2
(45) Date of Patent: Jul. 18, 2023

(54) LASER SIDE MODE SUPPRESSION RATIO CONTROL

(71) Applicant: Cisco Technology, Inc., San Jose, CA (US)

(72) Inventor: Jock T. Bovington, La Mesa, CA (US)

(73) Assignee: Cisco Technology, Inc., San Jose, CA (US)

( * ) Notice: Subject to any disclaimer, the term of this patent is extended or adjusted under 35 U.S.C. 154(b) by 358 days.

(21) Appl. No.: 16/940,659

(22) Filed: Jul. 28, 2020

(65) Prior Publication Data

US 2022/0037855 A1   Feb. 3, 2022

(51) Int. Cl.
*H01S 5/0683*   (2006.01)
*H01S 5/02255*   (2021.01)
*H01S 5/02253*   (2021.01)
*H01S 5/02216*   (2021.01)
*H01S 5/065*   (2006.01)
(Continued)

(52) U.S. Cl.
CPC .......... *H01S 5/0683* (2013.01); *H01S 5/0085* (2013.01); *H01S 5/02216* (2013.01); *H01S 5/02253* (2021.01); *H01S 5/02255* (2021.01); *H01S 5/0653* (2013.01); *H01S 5/0654* (2013.01); *H01S 5/0687* (2013.01)

(58) Field of Classification Search
CPC ..... H01S 5/0654; H01S 5/0687; H01S 5/0085
See application file for complete search history.

(56) References Cited

U.S. PATENT DOCUMENTS

| 4,749,277 A * | 6/1988 | Eichen | G01R 23/17 356/477 |
| 6,064,681 A * | 5/2000 | Ackerman | H04B 10/572 372/20 |

(Continued)

FOREIGN PATENT DOCUMENTS

| CN | 107565305 A | 1/2018 | |
| EP | 1363366 A1 * | 11/2003 | ......... H01S 5/06256 |

(Continued)

OTHER PUBLICATIONS

Guangcan Chen, Dan Lu, (Member, IEEE), Song Liang, Lu Guo, Wu Zhao, Yongguang Huang, and Lingjuan Zhao, "Frequency-Tunable Optoelectronic Oscillator with Synchronized Dual-Wavelength Narrow-Linewidth laser Output," IEEE Xplore, Nov. 6, 2018, pp. 1-6.

(Continued)

*Primary Examiner* — Tod T Van Roy
(74) *Attorney, Agent, or Firm* — Patterson + Sheridan, LLP

(57) ABSTRACT

Laser Side Mode Suppression Ratio (SMSR) control is provided via a logic controller configured to measure an SMSR of a carrier wave upstream of a modulator and measure an Average Optical Power (AOP) of the carrier wave downstream of the modulator; transmit a bias voltage based on the SMSR and the AOP to a laser driver for a laser generating the carrier wave; and transmit an attenuation level based on the SMSR and the AOP to a Variable Optical Attenuator (VOA) upstream of the modulator. In various embodiments the attenuation level and bias voltage can rise or fall together, or one may rise and one may fall to ensure the output optical signal meets specified SMSR and AOP values.

17 Claims, 7 Drawing Sheets

(51) Int. Cl.
*H01S 5/00* (2006.01)
*H01S 5/0687* (2006.01)

(56) References Cited

U.S. PATENT DOCUMENTS

| | | | | |
|---|---|---|---|---|
| 6,271,945 | B1* | 8/2001 | Terahara | H04J 14/0221 398/9 |
| 6,535,532 | B1* | 3/2003 | Ackerman | H01S 5/06256 372/20 |
| 7,230,963 | B2* | 6/2007 | Menon | H01S 5/06256 372/50.1 |
| 7,570,845 | B2* | 8/2009 | Welch | G02B 6/43 398/91 |
| 7,573,928 | B1* | 8/2009 | Pezeshki | H01S 5/0265 372/43.01 |
| 8,179,929 | B2* | 5/2012 | Gapontsev | H01S 3/2375 359/341.1 |
| 8,964,806 | B2* | 2/2015 | Ensher | H01S 5/0014 372/38.07 |
| 9,312,662 | B1* | 4/2016 | Larson | G02B 6/29352 |
| 9,438,343 | B2* | 9/2016 | Shukunami | H04J 14/0221 |
| 10,128,632 | B2* | 11/2018 | Kobayashi | H01S 5/042 |
| 10,700,494 | B2* | 6/2020 | Sorin | H01S 5/1833 |
| 2003/0095736 | A1* | 5/2003 | Kish, Jr. | H01S 5/02415 385/37 |
| 2009/0022495 | A1* | 1/2009 | Welch | G02B 6/12004 398/79 |
| 2010/0220952 | A1 | 9/2010 | Smith et al. | |
| 2015/0255944 | A1 | 9/2015 | Li et al. | |
| 2015/0311663 | A1 | 10/2015 | Li et al. | |
| 2015/0381305 | A1 | 12/2015 | Roberts et al. | |
| 2022/0037855 | A1* | 2/2022 | Bovington | H01S 5/02255 |

FOREIGN PATENT DOCUMENTS

| | | | |
|---|---|---|---|
| JP | H10290213 A | 10/1998 | |
| JP | 2019047053 A * | 3/2019 | |
| WO | WO-2005091451 A1 * | 9/2005 | H01S 5/06256 |
| WO | 2015132742 A1 | 9/2015 | |
| WO | WO-2022026992 A1 * | 2/2022 | H01S 5/02216 |

OTHER PUBLICATIONS

PCT, Notification of Transmittal of The International Search Report and The Written Opinon of The International Searching Authority, or The Declaration for Application PCT/US2021/070956 dated Jan. 11, 2022.

David F. Welch et al: "The Realization of Large-Scale Photonic Integrated Circuits and the Associated Impact of Fiber-Optic Communication Systems," Journal of Lightwave Technology, IEEE, USA, vol. 24, No. 12, dated Dec. 1, 2006, pp. 4674-4683.

PCT, Invitation to Pay Additional Fees and, Where Applicable, Protest Fee for Application PCT/US2021/070956 dated Nov. 10, 2021.

* cited by examiner

LASER SIDE MODE SUPPRESSION RATIO CONTROL

TECHNICAL FIELD

Embodiments presented in this disclosure generally relate to optical devices. More specifically, embodiments disclosed herein relate to the control and configuration of lasers.

BACKGROUND

In an ideal single wavelength laser, all of the power is contained in a main peak centered at the operational wavelength for the laser. However, in practice, a portion of the laser's power is included in other wavelengths. The Side Mode Suppression Ratio (SMSR) is a measure of power between a main mode in a waveform and the next-highest amplitude peak (also referred to as a side mode) exhibited in that waveform. Keeping the side modes suppressed relative to the main mode can be important to avoid cross-talk or drift between several optical signals carried on a shared transmission medium (e.g., on different carrier waves having different wavelengths multiplexed together according to a Wavelength Division Multiplexing schema).

Generally, for a laser to exhibit a higher SMSR value, and thereby provide a more idealized performance in terms of power containment, the fabricator employs stricter manufacturing tolerances during fabrication. These strict tolerances, however, can result in low throughput for the production of optical devices, as not all fabricators can meet the manufacturing tolerances, and those fabricators that can meet the manufacturing tolerances often produce the desired optical devices with considerable losses in yield (e.g., due to producing some products that are non-conforming to the manufacturing tolerances), or with higher in-field non-conformance rates.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure provides a system, comprising: a laser; a photodiode; a Side Mode Suppression Ratio (SMSR) sensor optically connected to the laser; a Variable Optical Attenuator (VOA) optically connected to the laser; an optical modulator having an input side connected to the VOA and an output side connected to the photodiode; and a logic controller electrically connected to the laser, the photodiode, the SMSR sensor, and the VOA, configured to adjust a bias of the laser and an attenuation level of the VOA based on an SMSR target, an SMSR reading from the SMSR sensor, and an optical power reading from the photodiode.

One embodiment presented in this disclosure provides a method, comprising: generating a carrier wave via a laser; measuring a Side Mode Suppression Ratio (SMSR) of the carrier wave; measuring an average optical power of the carrier wave; and adjusting at least one of a driving voltage or current for the laser and an attenuation level of the carrier wave to maintain the average optical power of the carrier wave and increase the SMSR.

One embodiment presented in this disclosure provides a logic controller, comprising: a processor; and a memory including instructions that when executed by the processor perform an operation including: measuring a Side Mode Suppression Ratio (SMSR) of a carrier wave; measuring an Average Optical Power (AOP) of the carrier wave; transmitting a bias voltage based on the SMSR and the AOP to a laser driver for a laser generating the carrier wave; and transmitting an attenuation level based on the SMSR and the AOP to a Variable Optical Attenuator (VOA).

Example Embodiments

The present disclosure provides for laser Side Mode Suppression Ratio (SMSR) control in optoelectronic circuits via an on-chip SMSR sensor and variable optical attenuator (VOA) to monitor and control the spectral quality of a laser while in operation to increase the useful ranges of lasers that can operate while exhibiting high SMSR, and therefore meet the intended specification of the transmitter. To aid in this, an SMSR sensor provides a signal to a controller that can both change the laser bias and be used to adjust the attenuation level of the VOA and modify the SMSR of the laser while the module remains operational within the specified average optical power (AOP) set for the output as measured in a monitor photodiode (PD). Accordingly, a wider range of materials can be used to fabricate the high-performance lasers as greater flexibility is provided to identify and correct spectral deficiencies in an operational optical module.

Figure 1:
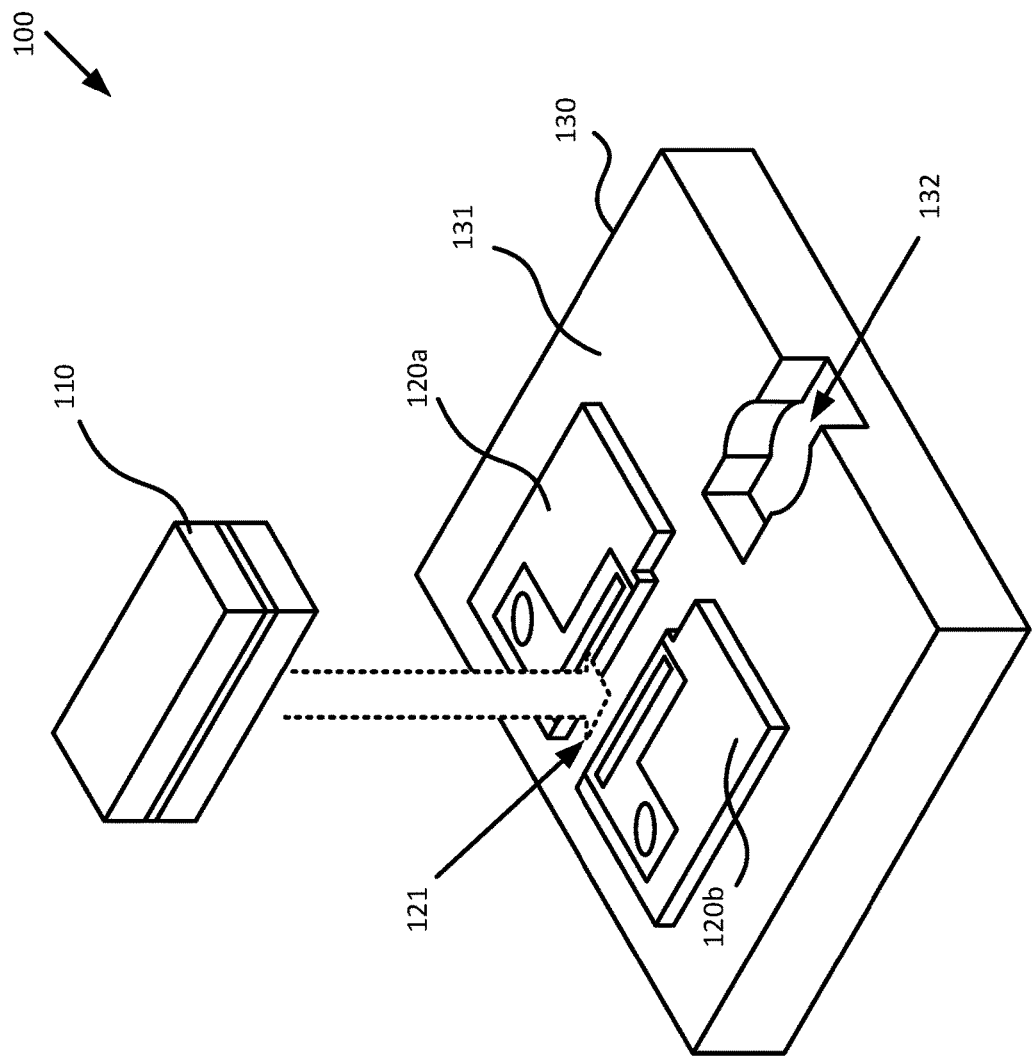
FIG. 1 illustrates a bench laser subassembly, according to embodiments of the present disclosure.
Figure 1:
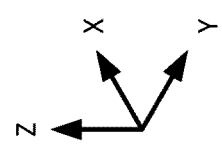
Figure 2:
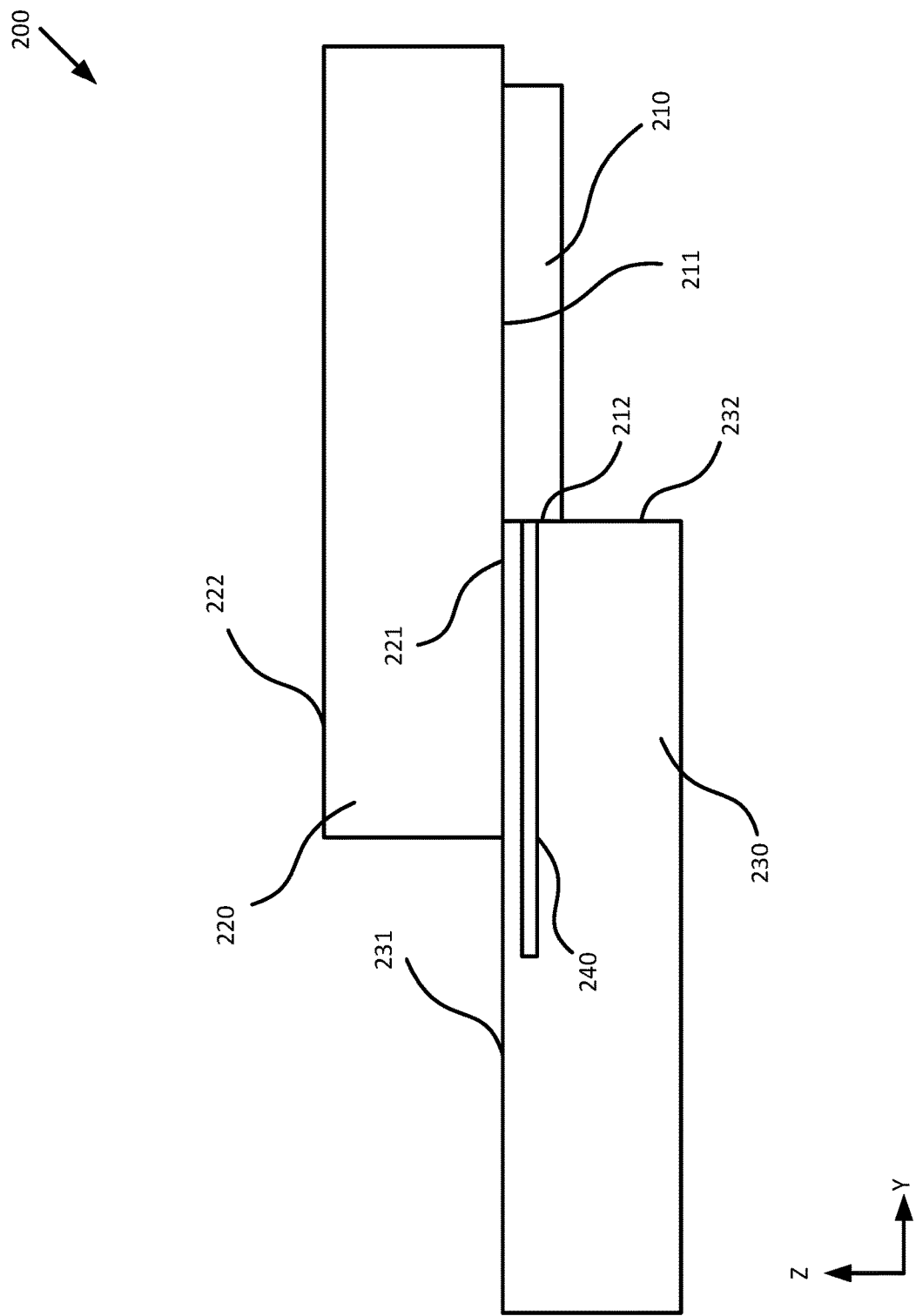
FIG. 2 illustrates a cantilevered laser subassembly, according to embodiments of the present disclosure.
Figure 3:
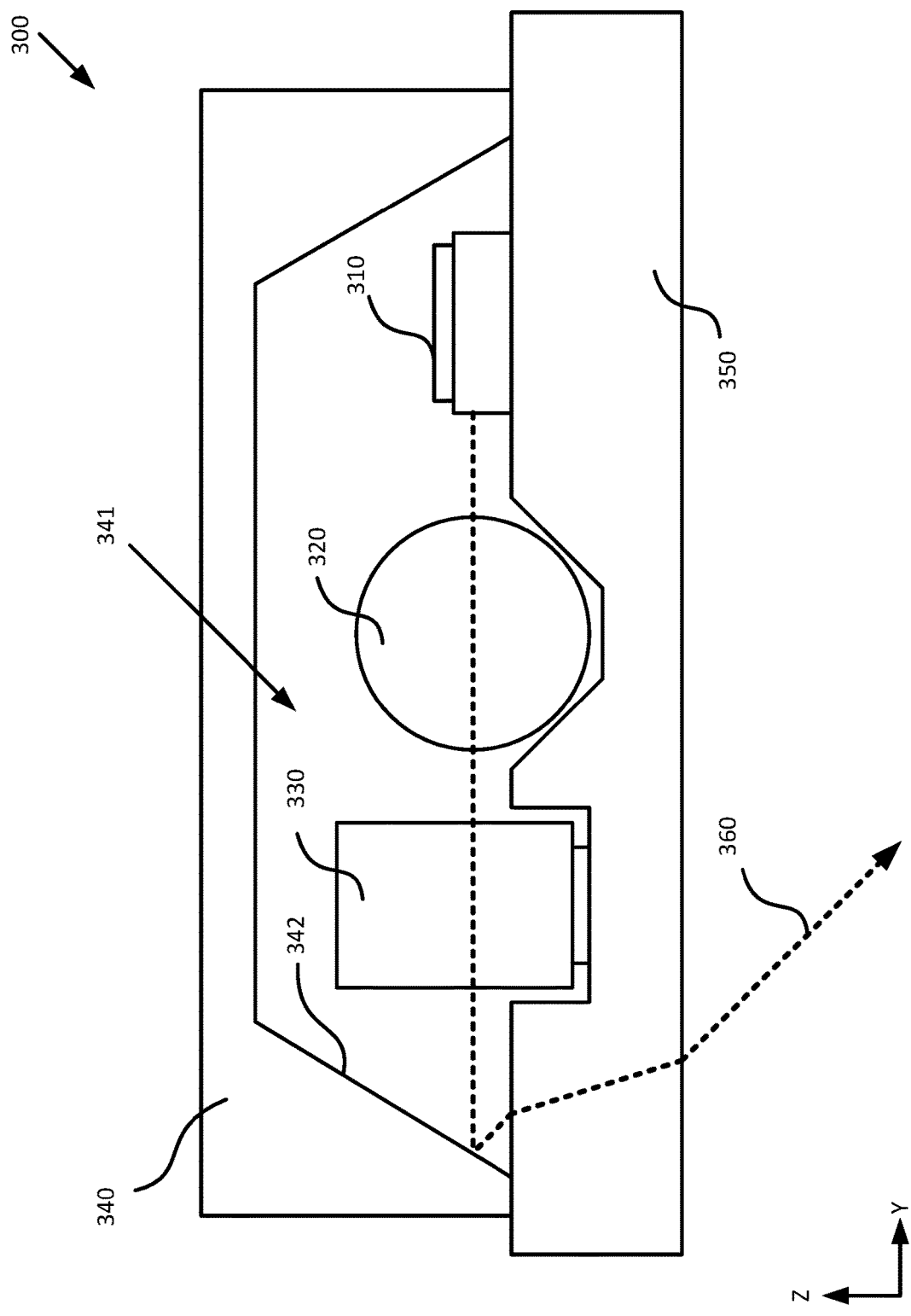
FIG. 3 illustrates a laser micro package mounting arrangement, according to embodiments of the present disclosure.

The present disclosure provides for the control of SMSR in lasers coupled to a photonic chip in various arrangements. FIGS. 1-3 illustrate some non-limiting examples of various coupling arrangements for lasers to optical components, with which the present disclosure can be applied.

FIG. 1 illustrates a bench laser subassembly 100, according to embodiments of the present disclosure. A laser 110 comprising an active gain medium (including quantum dots, quantum wells, quantum wires, and/or bulk material) surrounded by various cladding layers of III-V materials is connected to first and second mounting platforms 120a, 120b (platforms 120) by various epoxies or bonding techniques. The mounting platforms 120a, 120b include electrical contacts to supply a bias voltage across the laser 110 (e.g., from a laser driver (not illustrated)) to induce the laser 110 to generate an optical signal of a given intensity/amplitude. In various embodiments, the first platform 120a and the second platform 120b may define a channel 121 between one another to improve the optical or thermal regulation of an attached laser 110.

The mounting platforms 120a, 120b in turn are connected to a first surface 131 of the platform 130 or are fabricated as part of a platform 130. The platforms 120 can be made of Silicon, Aluminum Nitride (AlN) or another material, and provides a physical structure that can be bonded to various other components in an optoelectronic system. In various embodiments, the platforms 120 can include various connection features 132 for lenses, waveguides, or other components to attach to the platform 130, and to align those components relative to an attached laser 110.

FIG. 2 illustrates a cantilevered laser subassembly 200, according to embodiments of the present disclosure. In various embodiments, a laser 210 is mounted to a submount 220 which is bonded to a photonic chip 230 to form the cantilevered laser subassembly 200. In various embodiments, a first surface 221 of the submount 220 (e.g., a bottom surface of the submount 220) is connected to a first surface 231 of the photonic chip 230 (e.g., a top surface of the photonic chip 230) and to a first surface 211 of the laser 210 by various epoxies, solders, or physical interlocks (not illustrated). A second surface 222 of the submount 220 (e.g., a top surface of the submount 220) is left free or may be connected to one or more electrical integrated circuits to supply power to the laser 210, monitor characteristics of an optical signal granted by the laser 210, etc.

The submount 220 aligns the laser 210 with an input waveguide in the photonic chip 230 so that an output surface 212 of the laser 210 is positioned relative to one or more couplers 240 extending to an input surface 232 of the photonic chip 230 (e.g., an edge coupler). In various embodiments, the couplers 240 include prong couplers that accept an optical signal from an abutting coupling of the laser 210 and the photonic chip 230 and transfer the optical signal to one or more internal waveguides of the photonic chip 230. An abutting coupling arrangement can also be referred to as direct-coupling or butt-coupling arrangements.

FIG. 3 illustrates a laser micro package (LaMP) mounting arrangement 300, according to embodiments of the present disclosure. In various embodiments, a laser 310 is mounted with a lens 320, and an optical isolator 330 (such as a Faraday rotator or a polarization rotator) within a cavity 341 defined by a lid 340 and a platform 350. In various embodiments, the laser 310, lens 320, optical isolator 330, and lid 340 are secured to the platform 350 by various epoxies, solders, or physical interlocks (not illustrated).

The laser 310 generates a beam 360 that travels from the laser 310, through the lens 320 and the optical isolator 330 and reflects off of a mirror 342 defined on an inner surface of the lid 340 and into the platform 350. In various embodiments, the platform 350 may be made of an optically transmissive material, or may include a waveguide (not illustrated) that the beam 360 is reflected from the mirror 342 into. In various embodiments, the mirror 342 is a fixed surface with a fixed angle of reflection into the material of the platform 350 (and any waveguides defined therein), and the platform 350 includes a second tunable mirror (not illustrated) to selectively permit portions of the beam 360 further into the platform 350.

Figure 4A:
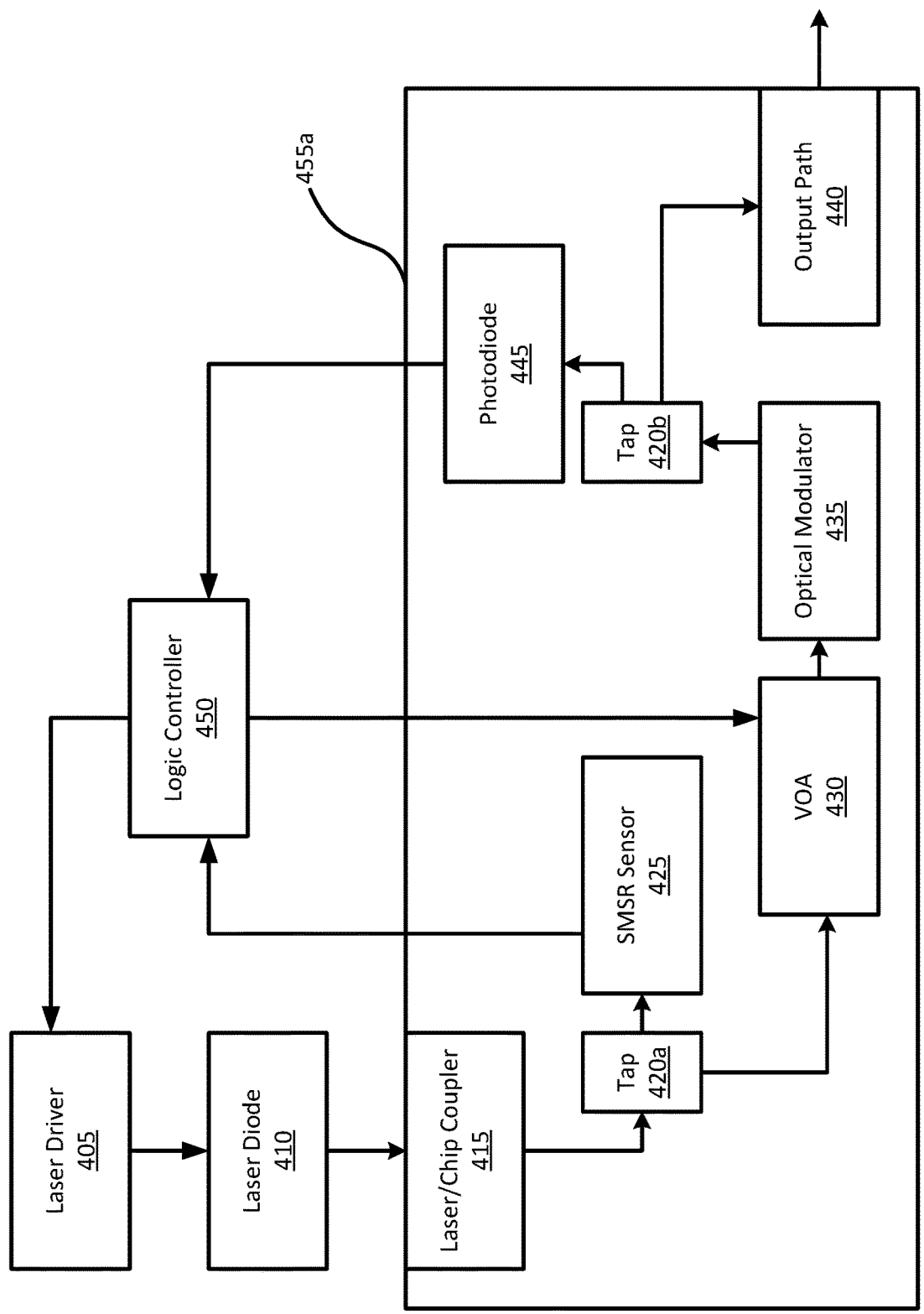
FIGS. 4A and 4B are schematic layouts for an optoelectronic system with controllable SMSR, according to embodiments of the present disclosure.
Figure 4B:
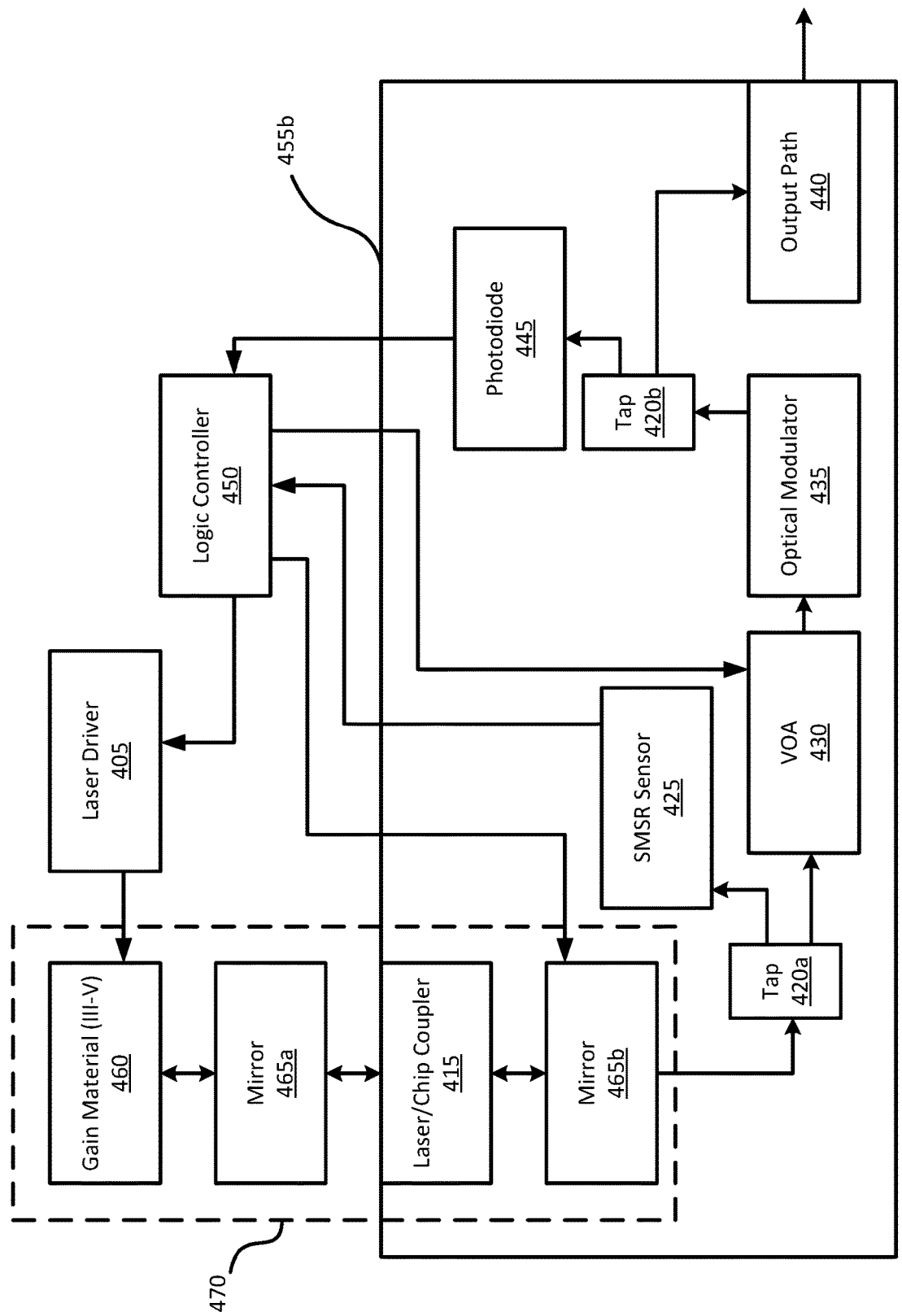

FIGS. 4A and 4B are schematic layouts for an optoelectronic system with controllable SMSR, according to embodiments of the present disclosure. In each of FIGS. 4A and 4B, a laser driver 405 controls a laser to output a carrier wave that is monitored (and modulated to carry a data signal) in a shared photonic chip (e.g., a first layout 455a in FIG. 4A and a second layout 455b in FIG. 4B). In various embodiments, the photonic chip is a silicon-based platform that includes various elements fabricated therein and the waveguides between those elements. The photonic chip receives light from a laser/chip coupler 415 and outputs light via an output path 440 (e.g., to a fiber optic cable, to a secondary photonic element, over an air-gap, etc.).

As used herein, components in the photonic chip that are closer to the laser source (e.g., the laser diode 410 of FIG. 4A or the hybrid laser 470 of FIG. 4B) can be referred to as being "upstream" of the components that are further from the laser source in the light path. Similarly, components in the photonic chip that are closer to the output path 440 can be referred to as being "downstream" of the components that are further from the output path 440 in the light path. Additionally, an arrangement in which a first element is described as being upstream or downstream relative to a second element may include one or more additional elements (and associated waveguides) between the first and second elements, or may describe a direct connection or coupling between the first and second elements.

The laser in FIG. 4A is a laser diode 410 that is provided on a separate chip or platform than the first layout 455a of the photonic chip, which may be provided via laser subassemblies such as are described in relation to FIGS. 1 and 2. In various embodiments, the laser diode 410 is a direct feedback (DFB) laser, which can include various lasers constructed from III-V materials. The laser driver 405 supplies a driving voltage (or current) across the laser diode 410 based on the bias selected by the logic controller 450, which is adjusted based on the measured SMSR and AOP from the carrier wave in the photonic chip to ensure that the generated carrier wave exhibits an SMSR and AOP within the predefined ranges for the optoelectronic system.

The laser in FIG. 4B is a hybrid laser 470 that is provided partially on in the second layout 455b of the photonic chip and partially externally to the photonic chip, which may be provided via a laser micro package, such as is described in relation to FIG. 3. The laser driver 405 supplies a driving voltage/current across a gain material 460 which generates a beam that is reflected from a first mirror 465a (such as a reflective surface coating of a lid) and into a portion of the photonic chip acting as a laser/chip coupler 415. The driving voltage/current is based on the bias selected by the logic controller 450, which is adjusted based on the measured SMSR and AOP from the carrier wave in the photonic chip to ensure that the generated carrier wave exhibits an SMSR and AOP within the predefined ranges for the optoelectronic system. Additionally, the logic controller 450 is connected to a controllable or tunable second mirror 465b of the hybrid laser 470 defined within the photonic chip to selectively permit a portion of the generated light into the photonic chip or to selectively reflect back into the gain material 460.

A first tap 420a (e.g., an optical tap) in the photonic chip receives the carrier wave in an unmodulated state (e.g., without a data signal included thereon) and splits the carrier wave into two portions: a first portion that the first tap 420a provides to an SMSR sensor 425 and a second portion that the first tap 420a provides to a VOA 430. In various embodiments, the first tap 420a provides the first portion with a lower percentage of the original signal power of the carrier wave than the second portion. For example, the first portion can carry approximately between 0.1% and 10% (or any value therebetween) of the power of the carrier wave, and the second portion carries the remainder thereof. In various embodiments, the first portion that the first tap 420a provides to the SMSR sensor 425 can be referred to as the tapped portion of the carrier wave in the unmodulated state.

An SMSR sensor 425 receives the first portion of the carrier wave from the first tap 420a. The SMSR sensor 425 monitors the power peaks (e.g., the modes) in the carrier wave and provides an electrical signal to the logic controller 450 that is representative of the SMSR in the carrier wave. In various embodiments, the logic controller 450 processes the SMSR level as a digital signal, and the SMSR sensor 425 is associated with an analog-to-digital converter to convert the analog SMSR reading to a digital reading, while in other embodiments, the logic controller 450 includes the analog-to-digital converter, or uses an analog reading of SMSR from the SMSR sensor 425. Various types of SMSR sensors are contemplated with different physical designs adapted to the wavelength of the optical carrier wave, construction processes used in fabricating the shared photonic chip, and the tolerances specified for the optoelectronic system. For example, an optoelectronic system with a higher SMSR specification may include a more precise SMSR sensor 425 than an optoelectronic system with a lower SMSR specification, or an optoelectronic system with a wider operational temperature range may include an SMSR sensor 425 that is less sensitive to changes in temperature than an optoelectronic system with a narrower operational temperature range.

The VOA 430 receives the second portion of the carrier wave from the first tap 420a and an electrical control signal from the logic controller 450. In various embodiments, the VOA 430 is one of a stepwise attenuator or a continuously variable attenuator that reduces the power level of the carrier wave based on a supplied attenuation level from the logic controller 450. In various embodiments, the attenuation level in the VOA 430 is set at initial calibration remains fixed as the initially calibrated value. In other embodiments, the attenuation level is continuously adjusted (or remains open to continuous adjustments on a periodic basis) during operation to account for different environmental and operational stresses on the optoelectronic system and/or degradation of the elements in the optoelectronic system over time.

Although not illustrated, various delay elements may be deployed on the respective waveguides between the first tap 420a shared by the SMSR sensor 425 and the VOA 430 to sync or otherwise align the phase of the carrier wave as measured by the SMSR sensor 425 and as attenuated by the VOA 430. These delay elements can account for different routing lengths from the first tap 420a to the respective SMSR sensor 425 and the VOA 430 and/or any delay induced by intervening optical or optoelectrical elements disposed between the first tap 420a and the SMSR sensor 425 or VOA 430.

The optical modulator 435 is downstream from the VOA 430 and receives the attenuated carrier wave at an input side from the VOA 430. In various embodiments, the optical modulator 435 in a Mach-Zehnder Modulator, but in other embodiments may be any type of modulator capable of encoding a data signal onto the carrier wave. As will be appreciated, the optical modulator 435 includes various electrical control elements to impart the data signal onto the carrier wave, which are not illustrated in FIGS. 4A and 4B. The optical modulator outputs the carrier wave (carrying a provided data signal modulated thereon) at an output side to a second tap 420b.

The second tap 420b in the photonic chip receives the modulated optical wave (e.g., the carrier wave with a data signal, if provided, included thereon) and splits the modulated optical wave into two portions: a third portion that the second tap 420b provides to an photodiode 445 or other light detector and a fourth portion that the second tap 420b provides to the output path 440. In various embodiments, the second tap 420b provides the third portion with a lower percentage of the average modulated signal power of the modulated optical wave than the fourth portion. For example, the third portion can carry approximately between 0.1% and 10% (or any value therebetween) of the power of the modulated optical wave, and the fourth portion carries the remainder thereof. In various embodiments, the third portion that the second tap 420b provides to the photodiode 445 can also be referred to the tapped portion of the carrier wave in the modulated state.

The photodiode 445 receives the third portion of the modulated optical wave (e.g., the carrier wave as modulated), and converts the optical signal into an electrical signal representative of the optical signal. The photodiode 445 measures the average optical power (AOP) of the modulated optical wave, and reports the AOP to the logic controller 450. In various embodiments, the logic controller 450 processes the SMSR level as a digital signal, and the photodiode 445 is associated with an analog-to-digital converter to convert the analog reading of AOP to a digital reading, while in other embodiments, the logic controller 450 includes the analog-to-digital converter, or uses an analog reading of optical power from the photodiode 445 to develop an understanding of the AOP.

Although not illustrated, various delay elements may be deployed on the respective waveguides between the second tap 420b shared by the photodiode 445 and the output path 440 to sync or otherwise align the phase of the modulated optical wave as measured by the photodiode 445 and as output from the photonic chip by the output path 440. These delay elements can account for different routing lengths from the second tap 420b to the respective photodiode 445 and the output path 440 and/or account for any delay induced by intervening optical or optoelectronic elements disposed between the second tap 420b and the photodiode 445 or output path 440.

The logic controller 450, receives electrical signals from the SMSR sensor 425 and the photodiode 445 that are representative of the SMSR and AOP, respectively, and outputs electrical signals to the laser driver 405 to control the bias/driving voltage or current in the laser and an attenuation level in the VOA 430. The logic controller 450 can include a microprocessor, a System on a Chip, or another computing device (such as is described in greater detail in regard to FIG. 6) to receive and process the input signal to generate appropriate output signals. In various embodiments, the logic controller 450 includes logic for how to determine what constitutes an appropriate output signal based on various specifications. The specifications can provide ranges in AOP for the modulated carrier wave to exhibit at the output path 440 and ranges in SMSR for the unmodulated carrier wave to exhibit. Accordingly, the logic controller 450 supplies the bias and the attenuation levels to maintain the optical power according to a predefined output power range while supplying a predefined SMSR range.

Figure 5:
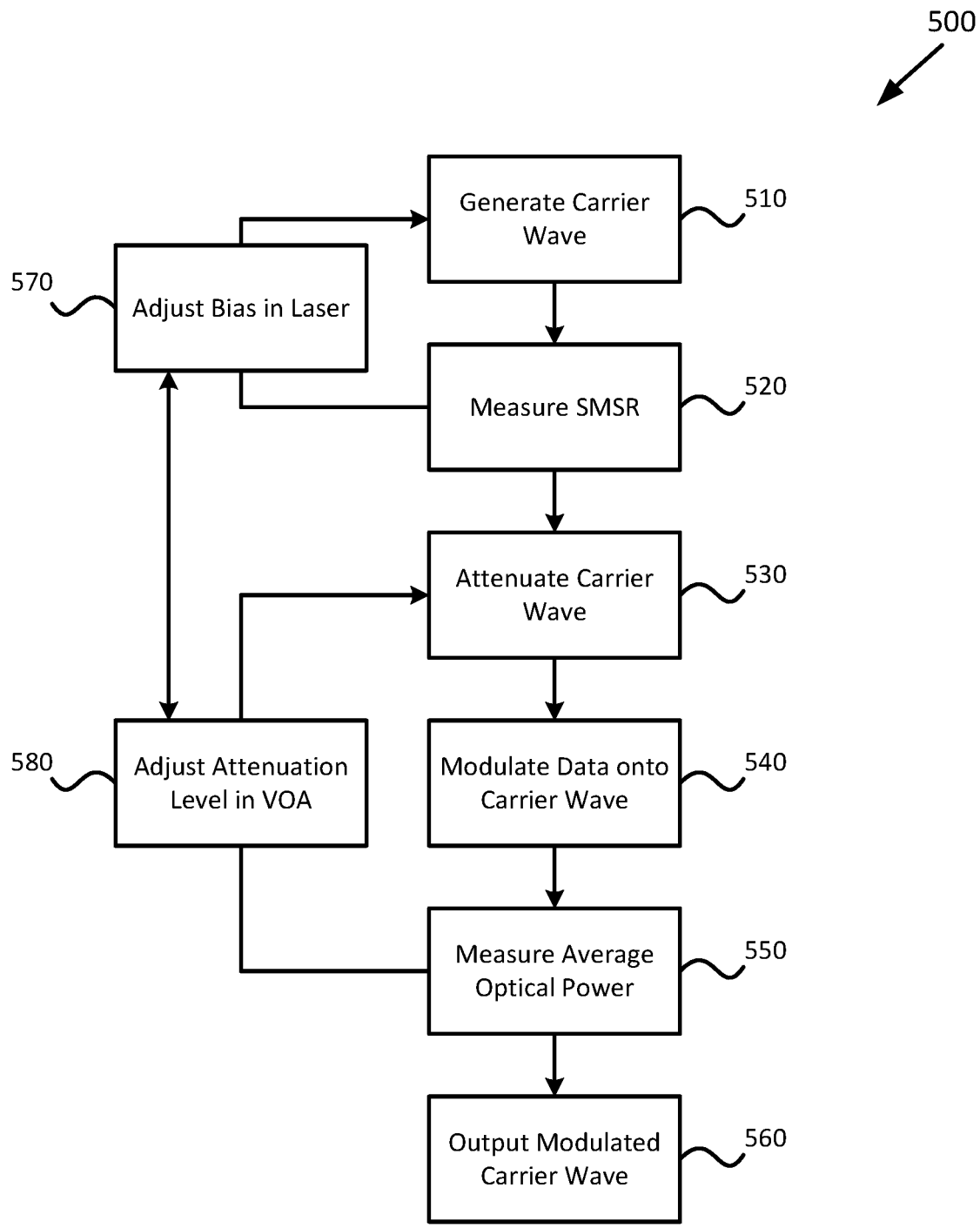
FIG. 5 is a flowchart of a method for laser SMSR control, according to embodiments of the present disclosure.

FIG. 5 is a flowchart of a method 500 for laser SMSR control, according to embodiments of the present disclosure. The method 500 begins at block 510, where a laser driver 405 induces a laser to generate a carrier wave (e.g., a continuous wave (CW)). The carrier wave is transmitted into a shared photonic chip where various optoelectronic elements measure features of the carrier wave and modify the optical signal for use by various downstream devices.

At block 520, an SMSR sensor 425 measures the SMSR of the carrier wave. The SMSR sensor 425 is located upstream of any optical modulators 435 in the shared photonic chip that are used to encode a data signal onto the carrier wave. Accordingly, the SMSR sensor 425 measures the SMSR of the carrier wave in an unmodulated state, and reports the measured SMSR of the optical carrier wave to a logic controller 450 as an electrical signal.

At block 530, a VOA 430 attenuates the carrier wave based on an attenuation level specified by the logic controller 450 (adjusted per block 580). The VOA 430 is located upstream of any optical modulators 435 in the shared photonic chip that are used to encode a data signal onto the carrier wave. Accordingly, the VOA 430 reduces the intensity of the carrier wave in an unmodulated state.

In various embodiments, block 520 and block 530 are performed substantially in parallel on different waveguides (e.g., splitting or tapping one input waveguide into two waveguides each carrying a version of the carrier wave) so that the portion of the carrier wave measured for SMSR and the portion of the carrier wave attenuated are in phase with one another.

At block 540, after the SMSR of the carrier wave is measured (per block 520) and is attenuated (per block 530), an optical modulator 435 modulates data onto the carrier wave. In various embodiments, a data signal is modulated onto the carrier wave to produce a modulated optical wave. The optical modulator 435 can use various hardware to encode the data signal onto the carrier wave in various embodiments.

At block 550, after the data signal is encoded onto the carrier wave (per block 540), a photodiode 445 measures the average optical power (AOP) in the modulated optical wave. Because the values included in the data signal can alter the power of the carrier wave when encode thereon, the photodiode 445 measures the AOP of the modulated optical wave, which can smooth any differences in amplitude caused by the encoded binary values of the data signal. Accordingly, the photodiode 445 measures AOP of the modulated optical wave to report the optical power of the modulated optical wave to the a logic controller 450 as an electrical signal.

At block 560, the modulated optical wave is output from the shared photonic chip via an output path 440. In various embodiments, block 550 and block 560 are performed substantially in parallel on different waveguides (e.g., splitting or tapping one input waveguide into two waveguides each carrying a version of the modulated optical wave) so that the portion of the modulated optical wave measured for AOP and the portion of the modulated optical wave output from the photonic chip are in phase with one another.

A logic controller 450 performs block 570 and block 580 substantially in parallel to adjust at least one of the driving voltage or current for the laser generating the carrier wave (per block 510) and the VOA 430 attenuating the carrier wave (per block 530).

At block 570, the logic controller 450 adjusts the bias in the laser by setting the driving voltage or current for a laser driver 405 associated with the laser. In some embodiments, the adjustment in bias is based on the SMSR reading and the specified SMSR range for the optoelectronic system. For example, when the SMSR sensor 425 indicates to the logic controller 450 that the SMSR in the carrier wave is below a threshold value, the logic controller 450 adjusts the bias to increase the driving voltage or current supplied by the laser driver 405 to the laser. Thereby, the laser produces an optical signal with a higher peak or main mode amplitude and a higher SMSR (e.g., to overcome material issues in fabrication that lower SMSR below the specified value). In additional embodiments, the adjustment of bias is based on the AOP reading and attenuation level such that the bias voltage is decreased when the SMSR is above a threshold value and one or more of the AOP reading or attenuation level is above a threshold value (e.g., to conserve power or maintain a constant output power for the optical signal).

At block 580, the logic controller 450 adjusts the attenuation level in the VOA 430. In some embodiments, the adjustment in attenuation level is based on the AOP reading and the specified AOP range for the optoelectronic system. For example, when the photodiode 445 indicates to the logic controller 450 that the AOP of the carrier wave is below a threshold value, the logic controller 450 adjusts the attenuation to decrease the amount that the VOA 430 attenuates the optical signal, thus permitting the carrier wave downstream from the VOA 430 to have a greater optical power for a given input optical power. In another example, when the photodiode 445 indicates to the logic controller 450 that the AOP of the modulated optical wave is above a threshold value, the logic controller 450 adjusts the attenuation to increase the amount that the VOA 430 attenuates the optical signal, thus permitting the carrier wave downstream from the VOA 430 to have a lower optical power for a given input optical power. In additional embodiments, the adjustment of attenuation level is based on the SMSR reading and bias such that the attenuation level is decreased when the AOP is above a threshold value and one or more of the SMSR reading or bias is above a threshold value (e.g., to conserve power or maintain a constant output power for the optical signal).

The adjustment made at each of block 570 and 580 can inform the adjustment made in the other of block 570 or block 580 so that the logic controller 450 maintains an output signal within specified ranges for both SMSR and AOP. For example, in response to the logic controller 450 increasing the bias in the laser, the logic controller 450 can also increase the attenuation level in the VOA 430 to maintain a output power of the optical signal that compensates for the increase in input power. Similarly, in response to the logic controller 450 decreasing the bias in the laser, the logic controller 450 can also decrease the attenuation level in the VOA 430 to maintain an output power of the optical signals that compensates for the decrease in input power. In an additional example, in response to the logic controller 450 increasing the attenuation level in the VOA 430, the logic controller 450 can also increase the bias in the laser to compensate for the higher optical attenuation in the photonic chip when producing an output power within a specified range. Similarly, in response to the logic controller 450 decreasing the attenuation level in the VOA 430, the logic controller 450 can also decrease the bias in the laser to compensate for the lower optical attenuation in the photonic chip when producing an output power within a specified range.

In various embodiments, the logic controller 450 can continuously, periodically, or only initially (e.g., during initial calibration) monitor and adjust the bias and attenuation levels. By continuously or periodically monitoring and adjusting the bias in the laser and the attenuation in the VOA 430, the logic controller 450 can account for different environmental and operational stresses on the optoelectronic system and/or degradation of the elements in the optoelectronic system over time. By only initially monitoring and adjusting the bias in the laser and the attenuation in the VOA 430, the optoelectronic system can account for initial fabrication differences, but can conserve power compared to continuously or periodically monitored/adjusted embodiments.

Figure 6:
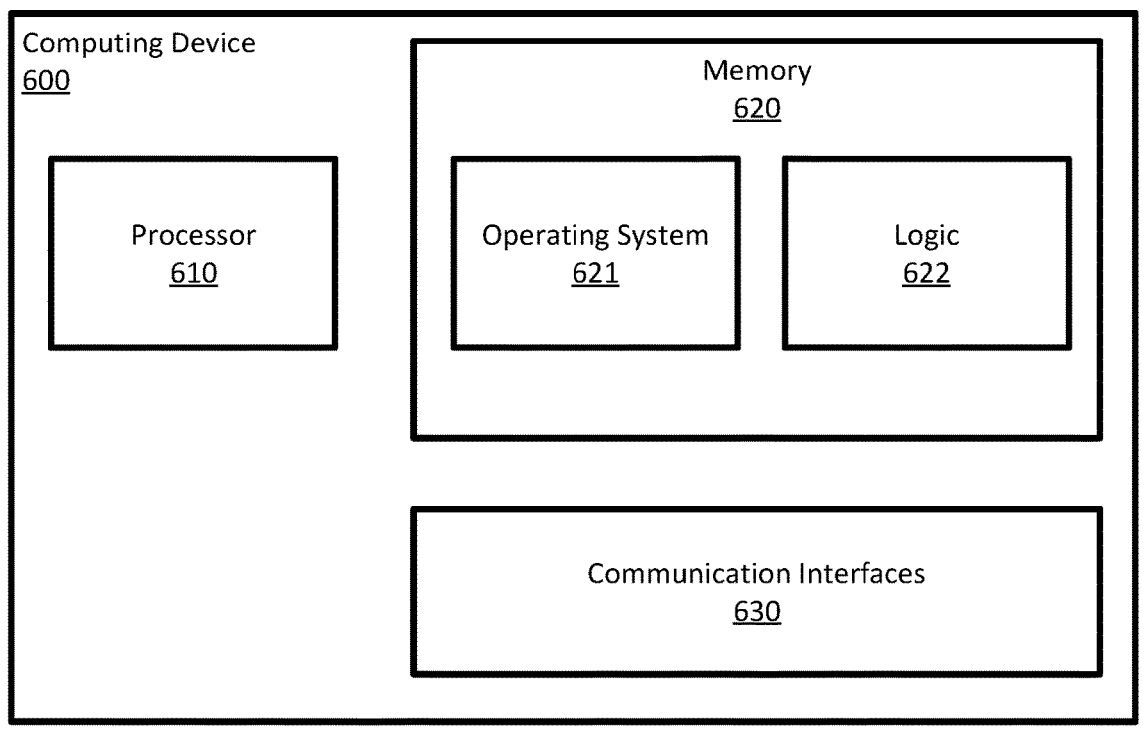
FIG. 6 illustrates hardware of a computing device, according to embodiments of the present disclosure.

FIG. 6 illustrates hardware of a computing device 600, as may be used in a logic controller 450 in various embodiments. The computing device 600 includes a processor 610, a memory 620, and communication interfaces 630. The processor 610 may be any processing element capable of performing the functions described herein. The processor 610 represents a single processor, multiple processors, a processor with multiple cores, and combinations thereof. The communication interfaces 630 facilitate communications between the computing device 600 and other devices. The communications interfaces 630 are representative of wireless communications antennas and various wired communication ports including out-pins and in-pins to a microcontroller. The memory 620 may be either volatile or non-volatile memory and may include RAM, flash, cache, disk drives, and other computer readable memory storage devices. Although shown as a single entity, the memory 620 may be divided into different memory storage elements such as RAM and one or more hard disk drives.

As shown, the memory 620 includes various instructions that are executable by the processor 610 to provide an operating system 621 to manage various functions of the computing device 600 and one or more sets of logic 622 to provide various functionalities to users of the computing device 600, which include one or more of the functions and functionalities described in the present disclosure. When provided as part of a optoelectronic system, the memory 620 (and/or the logic 622) may include the various operation ranges for SMSR and AOP that the optoelectronic system is toleranced to operate within and relationships between SMSR and AOP so that the computing device 600 can co-manage and balance the requirements for SMSR and AOP.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

I claim:

1. A system, comprising:
    a laser;
    a photodiode;
    a Side Mode Suppression Ratio (SMSR) sensor optically connected to the laser;
    a Variable Optical Attenuator (VOA) optically connected to the laser;
    an optical modulator having an input side connected to the VOA and an output side connected to the photodiode;
    a first tap disposed between the laser and both the SMSR sensor and the VOA;
    a second tap disposed between the optical modulator and both the photodiode and an output path, wherein the laser is optically connected via a first mirror to a laser/chip coupler, and wherein the laser is optically connected via a second tunable mirror to the first tap; and
    a logic controller electrically connected to the laser, the photodiode, the SMSR sensor, and the VOA, configured to adjust a bias of the laser and an attenuation level of the VOA based on an SMSR target, an SMSR reading from the SMSR sensor, and an optical power reading from the photodiode, wherein the logic controller is electrically connected to the second tunable mirror and is configured to tune the second tunable mirror to selectively to reflect a portion of a beam generated by the laser back to the laser.

2. The system of claim 1, wherein the logic controller is further configured to adjust the bias and the attenuation level to maintain the optical power according to a predefined output power range.

3. The system of claim 1,
    wherein the first tap provides a first portion of the beam generated by the laser to the SMSR sensor and a second portion of the beam to the VOA, wherein the second portion includes more optical power than the first portion; and
    wherein the second tap provides a third portion of the beam to the photodiode and a fourth portion of the beam to the output path, wherein the fourth portion includes more optical power than the third portion.

4. The system of claim 1, further comprising:
    a shared photonic chip in which the SMSR sensor, the VOA, the optical modulator, and the photodiode are defined and to which the laser and the logic controller are connected.

5. The system of claim 1, further comprising:
    a laser driver electrically connected between the logic controller and the laser, configured to supply a driving voltage or current to the laser according to the bias adjusted by the logic controller.

6. A method, comprising:
    generating a carrier wave via a laser;
    adjusting a position of a mirror that receives the carrier wave into a shared photonic chip;
    measuring a Side Mode Suppression Ratio (SMSR) of the carrier wave;
    measuring an average optical power of the carrier wave; and
    adjusting an attenuation level and at least one of a driving voltage or current for the laser of the carrier wave to maintain the average optical power of the carrier wave and increase the SMSR.

7. The method of claim 6, further comprising:
    in response to increasing the driving voltage or current, increasing the attenuation level.

8. The method of claim 6, further comprising:
    modulating the carrier wave to carry a data signal via an optical modulator, wherein the average optical power of the carrier wave is measured downstream of the optical modulator.

9. The method of claim 8, wherein the SMSR of the carrier wave is measured via an SMSR sensor located upstream of the optical modulator; and
    wherein the attenuation level of the carrier wave is adjusted via a Variable Optical Attenuator located upstream of the optical modulator.

10. The method of claim 6, further comprising:
    tuning a mirror included in the laser to selectively reflect a portion of the carrier wave back to the laser.

11. The method of claim 6, wherein the carrier wave is generated via a laser driver biasing the laser based on the SMSR and the average optical power.

12. A logic controller, comprising:
    a processor; and
    a memory including instructions that when executed by the processor perform an operation including:
        adjusting a position of a mirror that receives a carrier wave into a shared photonic chip;
        measuring, in the shared photonic chip, a Side Mode Suppression Ratio (SMSR) of the carrier wave;
        measuring, in the shared photonic chip, an Average Optical Power (AOP) of the carrier wave;
        transmitting a bias voltage based on the SMSR and the AOP to a laser driver for a laser generating the carrier wave; and
        transmitting an attenuation level based on the SMSR and the AOP to a Variable Optical Attenuator (VOA).

13. The logic controller of claim 12, wherein the SMSR is measured via an SMSR sensor based on a tapped portion of the carrier wave in an unmodulated state.

14. The logic controller of claim 12, wherein the AOP is measured via a photodiode based on a tapped portion of the carrier wave in a modulated state.

15. The logic controller of claim 12, wherein the operation further includes:
    tuning a mirror included in the laser to selectively reflect a portion of the carrier wave back to the laser.

16. The logic controller of claim 12, wherein the operation further includes:
    in response to determining to increase the bias voltage from a present level, increasing the attenuation level based on the increased bias voltage to maintain the
AOP within an output range.

17. The logic controller of claim 12, wherein the operation further includes:
in response to determining to decrease the bias voltage from a present level, decreasing the attenuation level based on the decreased bias voltage to maintain the AOP within an output range.

\* \* \* \* \*